(12) United States Patent
Mitamura

(10) Patent No.: US 7,213,977 B2
(45) Date of Patent: May 8, 2007

(54) OPTICAL MODULE WITH CAN PACKAGE

(75) Inventor: Kazuhiro Mitamura, Kanagawa (JP)

(73) Assignee: NEC Corporation, Kanagawa (JP)

( * ) Notice: Subject to any disclaimer, the term of this patent is extended or adjusted under 35 U.S.C. 154(b) by 0 days.

(21) Appl. No.: 11/524,206

(22) Filed: Sep. 21, 2006

(65) Prior Publication Data
US 2007/0065079 A1    Mar. 22, 2007

(30) Foreign Application Priority Data
Sep. 22, 2005    (JP) .............................. 2005-275489

(51) Int. Cl.
*G02B 6/36*    (2006.01)
*H01L 23/495*    (2006.01)
(52) U.S. Cl. ........................... 385/88; 385/89; 385/90; 385/91; 385/92; 385/94; 257/E25.032; 257/676
(58) Field of Classification Search ............ 385/88–94; 257/E25.032, 676
See application file for complete search history.

(56) References Cited

U.S. PATENT DOCUMENTS
2004/0264980 A1* 12/2004 Baek et al. .................. 398/202

FOREIGN PATENT DOCUMENTS
JP    2001-298217    10/2001
JP    2003-332667    11/2003
JP    2004-311923    11/2004

* cited by examiner

*Primary Examiner*—Frank G. Font
*Assistant Examiner*—Jerry Martin Blevins
(74) *Attorney, Agent, or Firm*—Young & Thompson

(57)    ABSTRACT

An optical module with a CAN package contains a stem and a lead. The stem has a hole penetrating the stem and an inner cylindrical surface surrounding the hole. The lead extends through the hole such that a gap exists between the lead and the inner cylindrical surface. The gap contains first and second portions which are arranged along the longitudinal direction of the hole. The first portion is filled with sealing material which is dielectric. The second portion is filled with air.

10 Claims, 4 Drawing Sheets

OPTICAL MODULE WITH CAN PACKAGE

BACKGROUND OF THE INVENTION

1. Field of the Invention

The present invention relates to an optical module for optical communication, and in particular, relates to an optical module with a CAN package.

2. Description of the Related Art

An Optical transceiver for optical communication, such as 10 gigabit small form factor pluggable (XFP) optical transceiver, often contains an optical module with a CAN package. The optical module is a coaxial type and enables high speed transmitting and/or receiving for optical communication. The optical transceiver converts an optical signal into an electric signal and/or an electric signal into an optical signal. The CAN package is one of basic packages that have airtight property, and is often used as a packaging for a laser diode installed in a compact disc drive (CDD).

FIG. 1A shows a side view of an optical transceiver 100 as an example of optical transceivers. The optical transceiver 100 has an optical module 101, a mount board 105 and a flexible print substrate 104. The optical module 101 is a coaxial type and enables high speed transmitting and/or receiving for optical communication. The optical module 101 contains a stem portion 121, a cap 122 and a connector 123 to which one end of an optical fiber cable is connected. The stem portion 121 contains a stem 103 and leads 102. One side of the cap 122 is fixed to the front end of the stem 103 by the resistance welding such that the cap 122 covers the front surface 131 of the stem 103. The connector 123 is attached to the opposite side of the cap 122. The cap 122 and the stem 103 form a CAN package of the optical module 101. The CAN package is an airtight packaging.

FIGS. 1B and 1C show the configuration of the stem portion 121 in the case that the optical module 101 is configured as a receiver. FIG. 1B shows a front view of the stem portion 121. FIG. 1C shows a cross-sectional view of the stem portion 121. As shown in FIGS. 1B and 1C, the stem portion 121 contains chip parts 106, a light receiving element 107, a pre-amplifier 108 and bonding wires 109. The chip parts 106, the light receiving element 107 and the pre-amplifier 108 are mounted on the front surface 131. The stem 103 has holes penetrating the stem 103 from the front surface 131 to the back surface 132 of the stem 103 and inner cylindrical surfaces, each of which surrounds each of the holes. Each of the leads 102 extends through each of the holes such that a gap 110 exists between that lead 102 and the inner cylindrical surface surrounding that hole. The gap 110 is entirely filled with sealing glass that seals the gap 110. Each of the leads 102 has first end which protrudes beyond the front surface 131 into the inside of the CAN package and second end which protrudes beyond the back surface 132 to the outside of the CAN package. The bonding wires 109 connect among the chip parts 106, the light receiving element 107, the pre-amplifier 108 and the first ends of the leads 102. The second ends of the leads 102 are connected to a circuit on the mount board 105 through lines on the flexible print substrate 104.

The box in FIG. 1C indicates the region 124 in the stem portion 121. The region 124 contains the gap 110 filled with sealing glass, a center portion of the lead 102 surrounded by the gap 110 and a gap-surrounding portion of the stem 103 surrounding the gap 110. The center portion of the lead 102 is placed between the first and second ends of the lead 102. The region 124 can be regarded as a coaxial line 111, as shown in FIG. 1D. The coaxial line 111 is an equivalent circuit model of the region 124. The gap 110 entirely filled with sealing glass is correspond to a dielectric between inner and outer conductors of the coaxial line 111. The center portion of the lead 102 is correspond to the inner conductor of the coaxial line 111. The gap-surrounding portion of the stem 103 is correspond to the outer conductor of the coaxial line 111. In this case, a dielectric constant $\in_r(111)$ of the dielectric in the coaxial line 111 is equal to that of glass. Thus, a characteristic impedance $Z_0(111)$ of the coaxial line 111 is represented by the following equation:

$$Z_0(111) = \frac{138 \times \mathrm{Log}(a/b)}{\sqrt{\varepsilon_r(111)}} \qquad (1)$$

where a is the inner diameter of the coaxial line 111 (the diameter of the lead 102).

b is the outer diameter of the coaxial line 111 (the outer diameter of sealing glass which fills the gap 110).

$\in_r(111)$ is the dielectric constant of the dielectric in the coaxial line 111.

The equation (1) is appropriate when the frequency of the signal transmitted in the coaxial line 111 is about 10 GHz.

The term "dielectric constant" indicates relative dielectric constant.

An operation of the optical transceiver 100 is described below. The light receiving element 107 receives an optical signal through the cap 122, converts the optical signal into an electric signal and outputs the electric signal to the pre-amplifier 108. The pre-amplifier 108 amplifies the electric signal and outputs the amplified electric signal, which is a high frequency signal, to the circuit on the mount board 105 through a plurality of the region 124 and the lines on the flexible print substrate 104.

The optical transceiver 100 is required to have a high frequency characteristic that enables a high bit rate transmission at bit rate of 10 GBps or more. Here, the optical transceiver 100 can be regarded to have two circuits. The first circuit contains the chip parts 106, the light receiving element 107, the pre-amplifier 108, the bonding wires 109 and the plurality of the region 124. The second circuit contains the lines on the flexible print substrate 104 and the circuit on the mount board 105. In order to attain the high frequency characteristic, it is important to attain impedance matching between the two circuits and to suppress parasitic inductance. The impedance matching can be attained by adjusting the impedance of the region 124. A parasitic inductance, which is caused by one of the bonding wires 109 that connects the pre-amplifier 108 and one of the first ends of the leads 102, can be suppressed by setting that bonding wire 109 short. In order to connect the pre-amplifier 108 and the first end of the lead 102, the longer length of the bonding wire 109 is required when the outer diameter b is the larger.

The optical module 101 is required to have a small size in order to miniaturize the optical transceiver 100. The small size of the optical module 101 can be obtained by setting the diameter c of the stem 103 small. The small diameter c can be obtained by setting the outer diameter b small. The smaller outer diameter b is required to reserve the wider area for mounting the chip parts 106 on the front surface 131.

Some conventional techniques, which are related to the present invention, are described below.

Japanese Laid Open Patent Application (JP-P2001-298217A) discloses an optical module. The optical module is designed such that a flexible print substrate, which contains a light receiving element, a light emitting element, electronic parts relevant to light reception and electronic parts relevant to light emission, and two reinforcement plates are placed in a body, and 10 lead pins are extended from the flexible print substrate to outside the body. The electronic parts relevant to light reception are placed on the first portion of the flexible print substrate and the electronic parts relevant to light emission are placed on the second portion of the flexible print substrate. The flexible print substrate and the reinforcement plates are placed in the body so that the flexible print substrate is bent to make the first and the second portions layered, and the reinforcement plates are inserted into the gap between the layered portions.

Japanese Laid Open Patent Application (JP-P2003-332667A) discloses a semiconductor laser module. Impedance of a glass sealing portion for sealing a lead pin that penetrates through a penetration hole formed in a stem base of the semiconductor laser diode is adjusted to a predetermined impedance by adjusting its dimension. Since a resistance element is connected in series to a laser diode mounted on the stem base, the matching with the impedance of the glass sealing portion is attained. Also, a connecting member having a transmission line is placed between the lead pin and the laser diode. The matching with the impedance of the glass sealing portion is attained by adjusting the shape and property of the transmission line.

Japanese Laid Open Patent Application (JP-P2004-311923A) discloses an optical semiconductor element package. The optical semiconductor element package contains a stem and a signal supply lead terminal. The stem has a front surface and a back surface. A penetration hole is formed in the stem to penetrate the stem from the front surface to the back surface. The signal supply lead terminal penetrates through the penetration hole such that the signal supply lead terminal is insulated from the penetration hole by an insulator between the penetration hole and the signal supply lead. The signal supply lead has a first portion which is placed in the penetration hole and a second potion which protrudes from the front surface. Then, so as to reduce the difference between characteristic impedance of a transmission line constituted by the penetration hole, the insulator and the first portion; and characteristic impedance of a transmission line constituted by the second portion, a grounded conductor is installed closely to the second portion.

Japanese Laid Open Patent Application (JP-P2005-12224A) discloses an optical receiving module with a TO-Can structure. The optical receiving module with the TO-can structure is characterized by including: a stem where holes penetrating the stem between both surface of the stem are formed; and a photo diode which is located on the front surface of the stem and converts an optical signal inputted therein into a current and further including a trans-impedance amplifier, signal leads, ground leads and waveguides. The trans-impedance amplifier is located on the front surface of the stem and converts the current, which is outputted from the photo diode, into high frequency signals having phases opposite to each other, and amplifies the signals and then outputs the amplified signals through respective output terminals to outside. Each of the signal leads penetrates through each of the holes. The signal leads output the amplified signals to the outside. The stem is grounded to the outside of the optical receiving module through the ground leads extending from the back of the stem. The waveguides are fixed to the predetermined position on the front surface of the stem in order to attain the impedance matching between the trans-impedance amplifier and the leads, and transmit the amplified signals outputted from the respective output terminals of the trans-impedance amplifier through the corresponding electric routes to the respective leads, respectively.

SUMMARY OF THE INVENTION

It has now been discovered that, in the case of the structure shown in FIGS. 1A to 1D, when the equation (1) is used to design the optical module 101, the outer diameter b (the outer diameter of sealing glass which fills the gap 110) should be large. The large outer diameter b causes a problem that it is impossible to satisfy the miniaturization of the optical module 101, the suppression of parasitic inductance and the reservation of the enough area for mounting the chip parts 106 on the front surface 131.

For example, in the case that the desired characteristic impedance $Z_0(111)$ is set at 50Ω in order to attain impedance matching, if when it is assumed such that $\in_r(111)=4.1$ (the minimum dielectric constant among the dielectric constants of existing glasses by which the airtight property can be reserved) and a=0.3 mm (the minimum diameter at which the strength of the lead 102 can be attained), b should be 1.35 mm. In other words, there are only three parameters a, b and $\in_r(111)$ to be adjusted in order to attain impedance matching by the use of the equation (1) Thus, there is the limit in trying to reduce the outer diameter b.

In an aspect of the present invention, an optical module with a CAN package contains a stem and a lead. The stem has a hole penetrating the stem and an inner cylindrical surface surrounding the hole. The lead extends through the hole such that a gap exists between the lead and the inner cylindrical surface. The gap contains first and second portions which are arranged along the longitudinal direction of the hole. The first portion is filled with sealing material which is dielectric. The second portion is filled with air.

In the optical module thus constructed, the region containing the lead, the gap and a gap-surrounding portion of the stem can be regarded as a coaxial line. The lead, the gap and the gap-surrounding portion of the stem are correspond to an inner conductor, dielectric and outer conductor of the coaxial line, respectively. The coaxial line has one and the other coaxial lines connected in series. The first potion of the gap is correspond to a dielectric of the one coaxial line. The second portion of the gap is correspond to a dielectric of the other coaxial line. Adjusting impedance of the region can attain impedance matching between two circuits. One of two circuits contains the lead. The other of two circuits is connected to the lead. Therefore, the outer diameter of the sealing material can be smaller than the lower limit of that in the conventional structure, while attaining impedance matching, and while setting the diameter of the lead large enough to reserve the strength of the lead. The impedance matching leads to a high frequency characteristic that enables a high bit rate transmission of signals from or to the optical module. The small outer diameter of the sealing material leads to the miniaturization of the optical module and reservation of the area for mounting electronic parts on the stem.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An embodiment of the present invention will be described below with reference to the accompanying drawings.

Figure 1A:
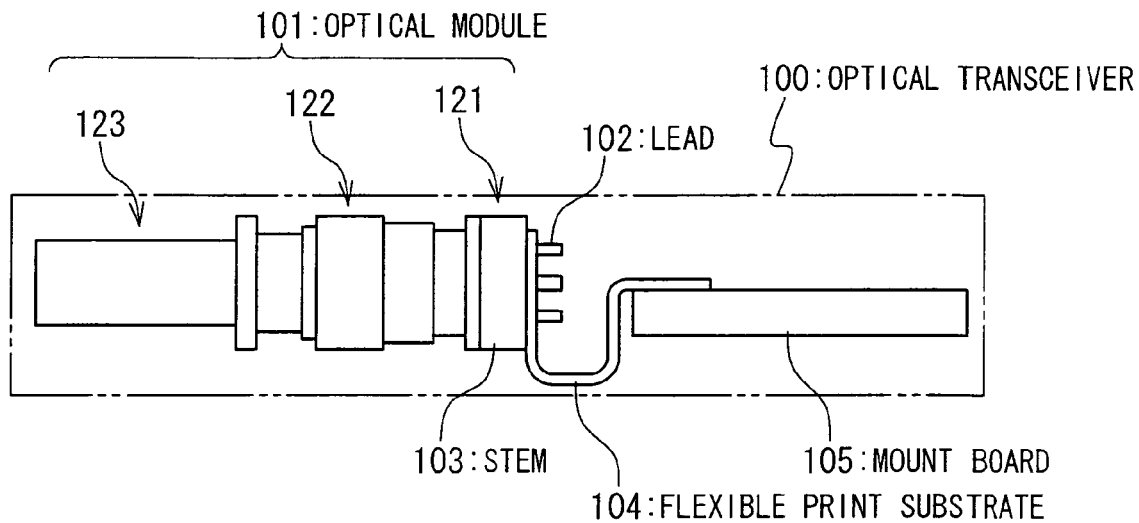
FIG. 1A shows a side view of a conventional optical transceiver.
Figure 1B:
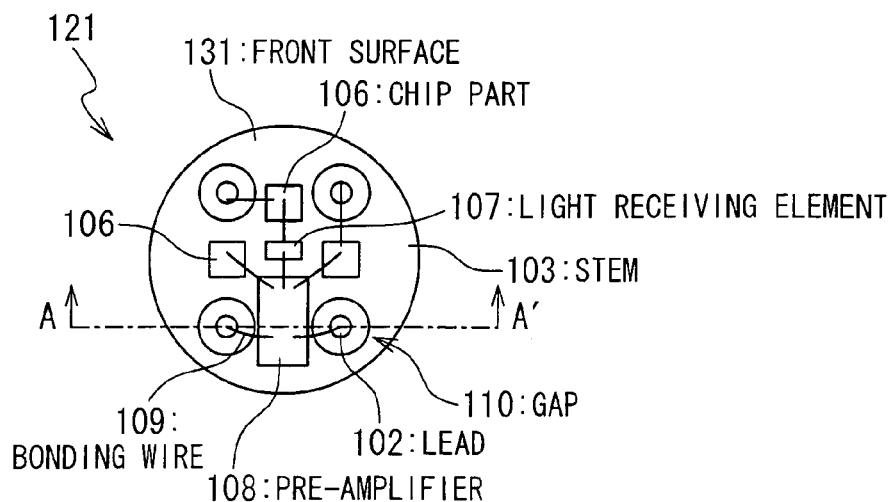
FIG. 1B shows a front view of a stem portion of an optical module which is a component of the optical transceiver in FIG. 1A.
Figure 1C:
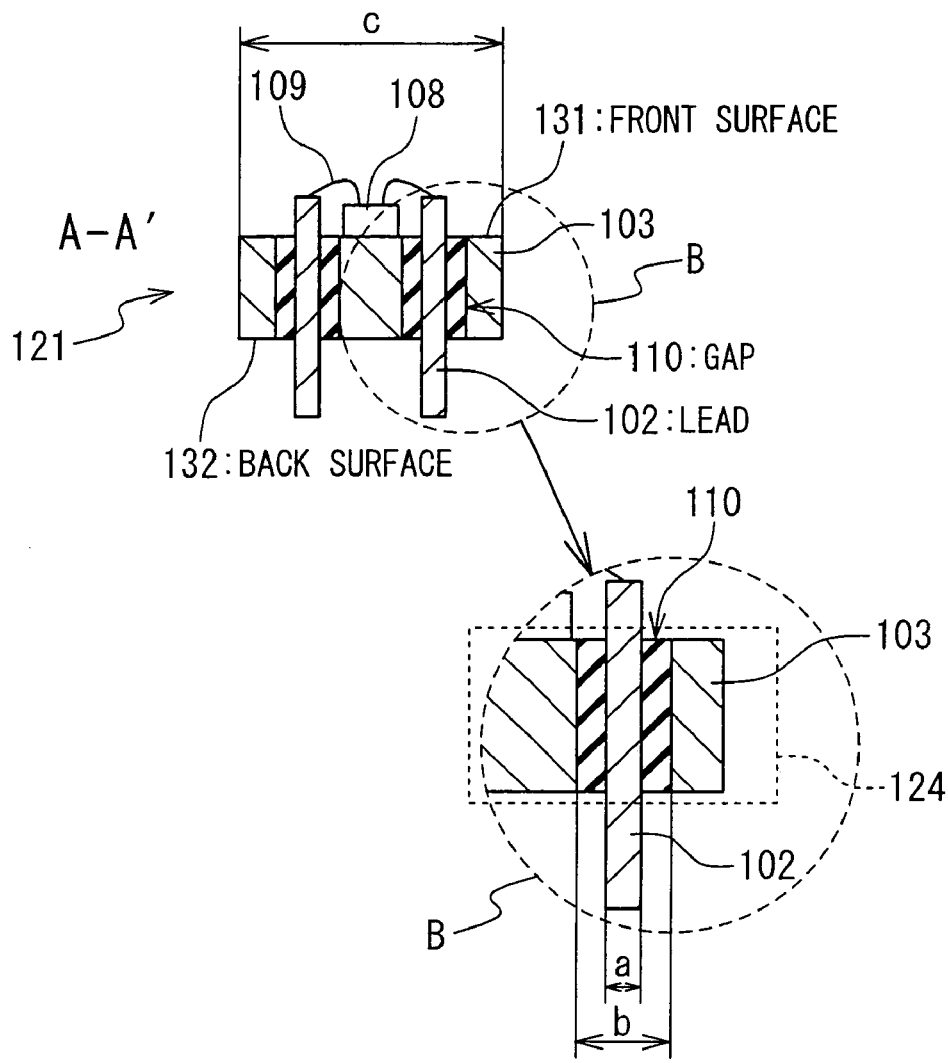
FIG. 1C shows a cross-sectional view of the stem portion in FIG. 1B.
Figure 1D:
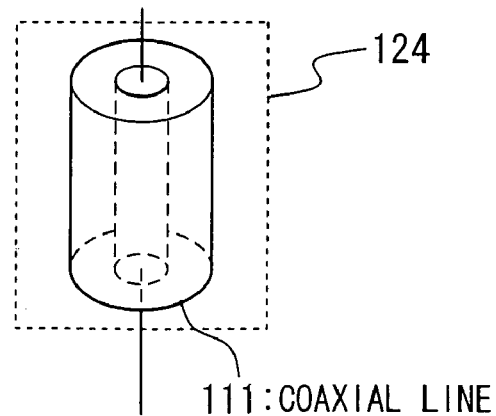
FIG. 1D shows an equivalent circuit model of the region indicated by the box in FIG. 1C.
Figure 2A:
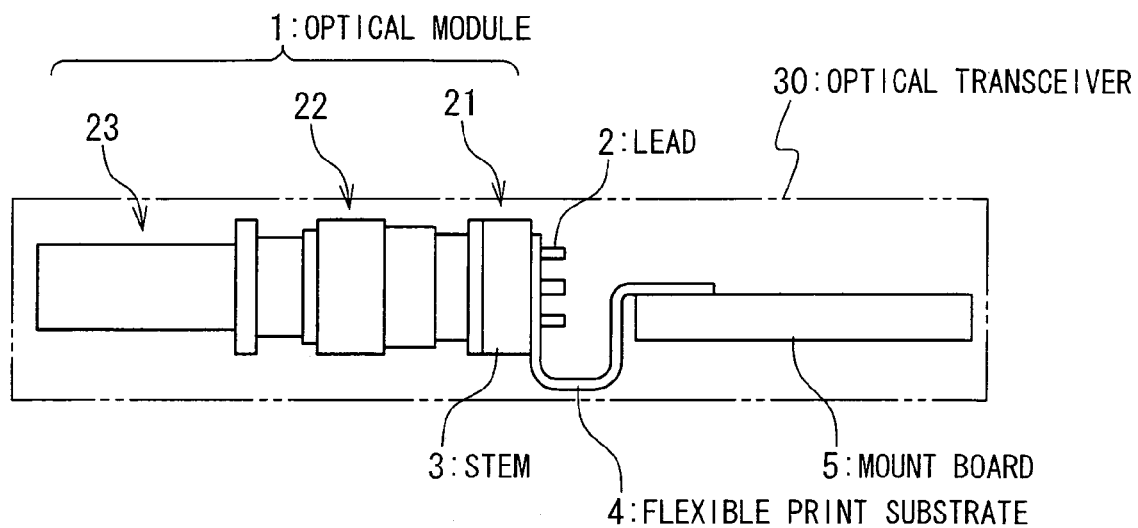
FIG. 2A shows a side view of an optical transceiver according to an embodiment of the present invention.
Figure 2B:
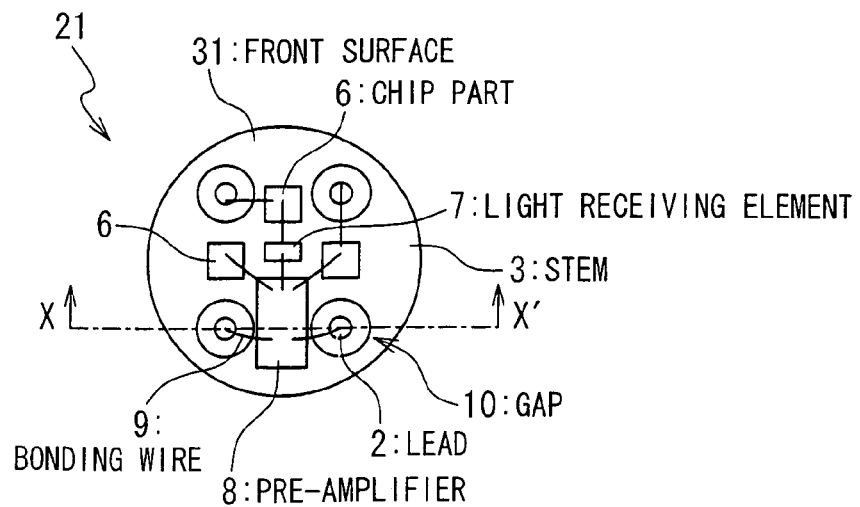
FIG. 2B shows a front view of a stem portion of an optical module which is a component of the optical transceiver in FIG. 2A.
Figure 2C:
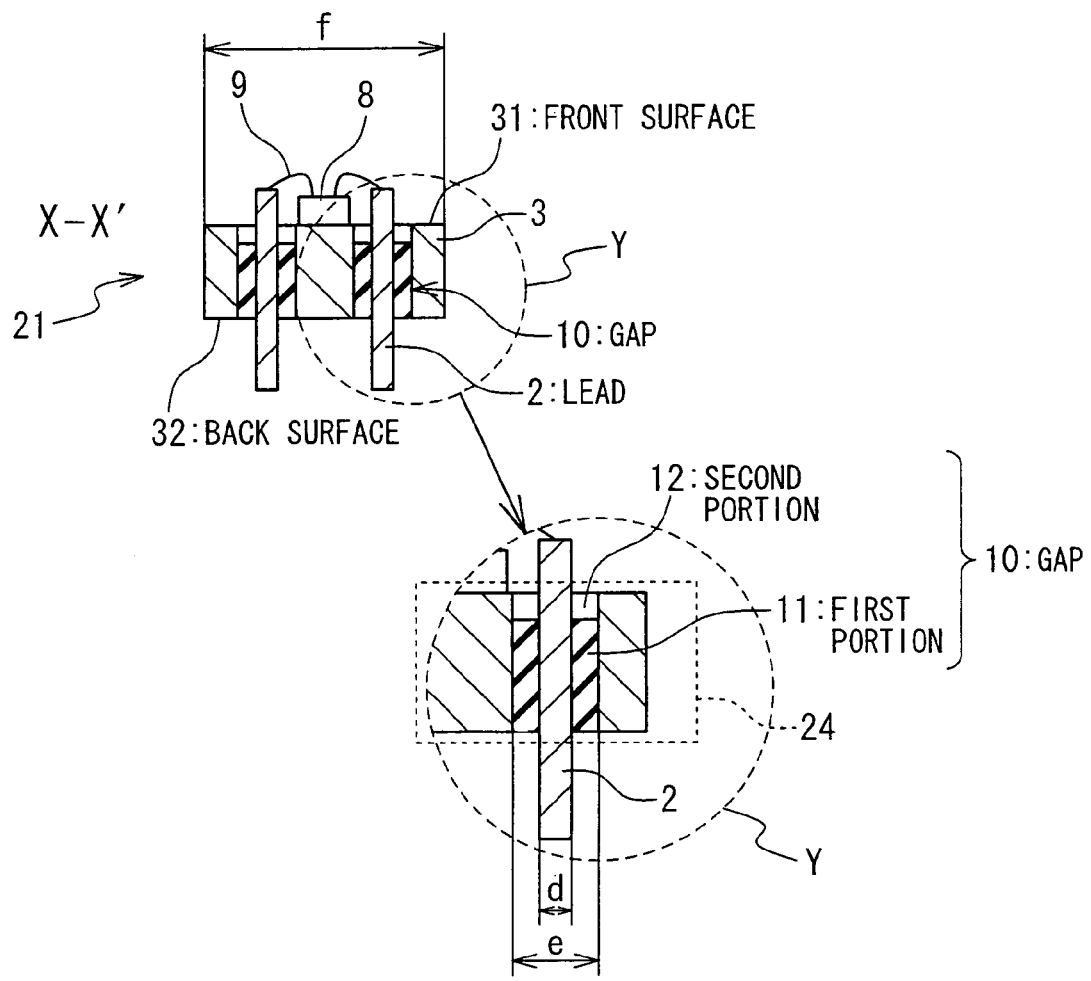
FIG. 2C shows a cross-sectional view of the stem portion in FIG. 2B.

FIG. 2A shows a side view of an optical transceiver 30 according to the embodiment of the present invention. The optical transceiver 30 contains an optical module 1, a mount board 5 and a flexible print substrate 4. The optical module 1 is a coaxial type and enables high speed transmitting and/or receiving for optical communication. The optical module 1 contains a stem portion 21, a cap 22 and a connector 23 to which one end of an optical fiber cable is connected. The stem portion 21 contains a stem 3 and leads 2. One side of the cap 22 is fixed to the front end of the stem 3 by the resistance welding such that the cap 22 covers the front surface 31 of the stem 3. The connector 23 is attached to the opposite side of the cap 22. The cap 22 and the stem 3 form a CAN package of the optical module 1. The CAN package is a airtight packaging FIGS. 2B and 2C show the configuration of the stem portion 21 in the case that the optical module 1 is configured as a receiver. FIG. 2B shows a front view of the stem portion 21. FIG. 2C shows a cross-sectional view of the stem portion 21. As shown in FIGS. 2B and 2C, the stem portion 21 contains chip parts 6, a light receiving element 7, a pre-amplifier 8 and bonding wires 9. The Chip parts 6, the light receiving element 7 and the pre-amplifier 8 are mounted on the front surface 31. The stem 3 has holes penetrating the stem 3 from the front surface 31 to the back surface 32 of the stem 3 and inner cylindrical surfaces, each of which surrounds each of the holes. Each of the leads 102 extends through each of the holes such that a gap 10 exists between that lead 102 and the inner cylindrical surface surrounding that hole. In other words, the lead 2 extends in the hole in the direction in which the hole extends. Sealing glass fills partially the gap 10 to seal the gap 10. Each of the leads 2 has a first end which protrudes beyond the front surface 31 into the inside of the CAN package and a second end which protrudes beyond the back surface 32 to the outside of the CAN package. The bonding wires 9 connect among the chip parts 6, the light receiving element 7, the pre-amplifier 8 and the first ends of the leads 2. The second ends of the leads 2 are connected to a circuit on the mount board 5 through lines on the flexible print substrate 4. The gap 10 contains two portions 11 and 12. The first portion 11 of the gap 10 is filled with sealing glass. No sealing glass exists in the second portion 12 of the gap 10. In other words, the second portion 12 is filled with air. The first portion 11 and the second portion 12 are arranged along the longitudinal direction of the hole. The first portion 11 is placed adjacent to the back surface 32 and the second portion 12 is placed adjacent to the front surface 31. As the second portion 12 is placed in the inside of the CAN package, water invasion into the CAN package through the gap 10 can be prevented.

The sealing glass that fills partially the gap 10 can be easily formed by reducing the amount of glass which is supplied into the gap 10 and by constituting properly tools for filling the gap 10. If the length of the first portion 11 is 80% or more of the height of the stem 3 (the distance between the front and back surfaces 31 and 32), namely, 80% or more of the gap 10 is filled with sealing glass, the airtight property can be obtained without any mistake. Hence, the stable productivity and reliability of the optical module 1 can be obtained similarly to the case of the conventional structure. In other words, it is preferable that the length of the second portion 12 may be 20% or less of the height of the stem 3. Hence, it is preferable that the length of the first portion 11 along the longitudinal direction of the hole is 80% or more and less than 100% of the length of the hole along the longitudinal direction.

Figure 2D:
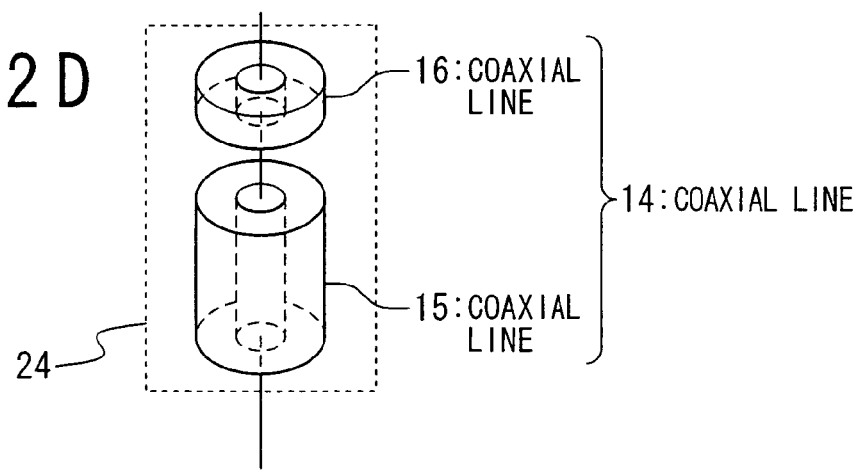
FIG. 2D shows an equivalent circuit model of the region indicated by the box in FIG. 2C.

The box in FIG. 2C indicates the region 24 in the stem portion 21. The region 24 contains the gap 10 partially filled with sealing glass, a center portion of the lead 2 surrounded by the gap 10 and a gap-surrounding portion of the stem 3 surrounding the gap 10. The center portion of the lead 2 is placed between the first and second ends of the lead 2. The center portion of the lead 2 contains a first center portion which is surrounded by the first portion 11 and a second center portion which is surrounded by the second portion 12. The gap-surrounding portion of the stem 3 contains first and second gap-surrounding portions of the stem 3. The first gap-surrounding portion of the stem 3 surrounds the first portion 11. The second gap-surrounding portion of the stem 3 surrounds the second portion 12. The first center portion of the lead 2, the first portion 11 and the first gap-surrounding portion of the stem 3 constitute a low impedance element. The second center portion of the lead 2, the second portion 12 and the second gap-surrounding portion of the stem 3 constitute high impedance element. The region 24 can be regarded as a coaxial line 14, which has different coaxial lines 15 and 16 connected in series, as shown in FIG. 2D. The coaxial line 14 is an equivalent circuit model of the region 24. The coaxial line 15 is correspond to the low impedance element. The coaxial line 16 is correspond to the high impedance element. The first portion 11 is correspond to a dielectric between inner and outer conductors of the coaxial line 15. The first center portion of the lead 2 and the first gap-surrounding portion of the stem 3 are correspond to the inner and outer conductors of the coaxial line 15, respectively. The second portion 12 is correspond to a dielectric between inner and outer conductors of the coaxial line 16. The second center portion of the lead 2 and the second gap-surrounding portion of the stem 3 are correspond to the inner and outer conductors of the coaxial line 16, respectively. The dielectric constant $\in_r(15)$ of the dielectric in the coaxial line 15 is equal to that of glass. The dielectric constant $\in_r(16)$ of the dielectric in the coaxial line 16 is equal to that of air. Thus, a characteristic impedance $Z_0(15)$ of the coaxial line 15 and a characteristic impedance $Z_0(16)$ of the coaxial line 16 are represented by the following equations:

$$Z_0(15) = \frac{138 \times \text{Log}(d/e)}{\sqrt{\varepsilon_r(15)}} \quad (2)$$

$$Z_0(16) = \frac{138 \times \text{Log}(d/e)}{\sqrt{\varepsilon_r(16)}} \quad (3)$$

where d is the common inner diameter of the coaxial lines 15 and 16 (the diameter of the lead 2).

e is the common outer diameter of the coaxial lines 15 and 16 (the outer diameter of sealing glass which fills the first portion 11).

$\in_r(15)$ and $\in_r(16)$ are the dielectric constants of the dielectrics in the coaxial lines 15 and 16, respectively.

The equations (2) and (3) are appropriate when the frequency of the signal transmitted in the coaxial lines 15 and 16 is about 10 GHz.

An operation of the optical transceiver 30 is described below. The light receiving element 7 receives an optical signal, converts the optical signal into an electric signal and outputs the electric signal to the pre-amplifier 8. The pre-amplifier 8 amplifies the electric signal and outputs the amplified electric signal, which is a high frequency signal, to the circuit on the mount board 5 through a plurality of the region 24 and the lines on the flexible print substrate 4. In other words, the light receiving element 7 is configured to receive an optical signal through the cap 22, to convert the optical signal into an electric signal and to output the electric signal to the circuit on the mount board 5 through the second end of the lead 2.

The optical transceiver 30 is required to have a high frequency characteristic that enables a high bit rate transmission at bit rate of 10 GBps or more. Here, the optical transceiver 30 can be regarded to have two circuits. The first circuit contains the chip parts 6, the light receiving element 7, the pre-amplifier 8, the bonding wires 9 and the plurality of the region 24. The second circuit contains the lines on the flexible print substrate 4 and the circuit on the mount board 5. In order to attain the high frequency characteristic, it is important to attain impedance matching between the two circuits and to suppress parasitic inductance. The impedance matching can be attained by adjusting the impedance of the region 24. A parasitic inductance, which is caused by one of the bonding wires 9 that connects the pre-amplifier 8 and one of the first ends of the leads 2, can be suppressed by setting that bonding wire 9 short. In order to connect the pre-amplifier 8 and the first end of the lead 2, the longer length of the bonding wire 9 is required when the outer diameter e is the larger.

The optical module 1 is required to have a small size in order to miniaturize the optical transceiver 30. The small size of the optical module 1 can be obtained by setting the diameter f of the stem 3 small. The small diameter f can be obtained by setting the outer diameter e small. The smaller outer diameter e is required to reserve the wider area for mounting the chip parts 6 on the front surface 31.

In case of the structure according to the embodiment of the present invention, a method that carries out the impedance matching by adjusting impedance of the region 24 in which the low impedance element and the high impedance element are adjacent to each other can be employed. Therefore, the selection range of the outer diameter e (the outer diameter of sealing glass which fills the first portion 11) can be enlarged. That is, the outer diameter e can be smaller than the lower limit of that in the conventional structure, while attaining impedance matching, and while setting the diameter d of the lead 2 large enough to reserve the strength of the lead 2.

For example, when the dielectric constants $\in_r$ (15) and $\in_r(16)$ is assumed to be 4.1 (the minimum dielectric constant among dielectric constants of existing glasses by which the airtight property can be reserved) and 1.0 (the dielectric constant of air), respectively, and when the diameters d and e are set at 0.3 mm and 0.75 mm, respectively, the impedances $Z_0((15)$ and $Z_0(16)$ are obtained from the equations (2) and (3) to be 35Ω and 71.2Ω, respectively.

In the structure according to the embodiment of the present invention, the outer diameter e can be small, which contributes to the miniaturization of the stem 3. This leads to the miniaturization of the optical module 1 and the miniaturization of the optical transceiver 30.

The small outer diameter e also enables enlarging the area for mounting the chip parts 6 on the front surface 31.

When the outer diameter e is small, the position of the pre-amplifier 8 can be close to the first end of the lead 2 that is connected to the pre-amplifier 8 by one of the bonding wires 9. Thus, the length of that bonding wire 9 can be shorter than that in the conventional structure. The short length of the bonding wire 9 leads to suppression of parasitic inductance caused by the bonding wire 9. Consequently, the high frequency characteristic can be better than that of the conventional structure.

By the way, sealing glass that fills the first portion 11 can be replaced by other sealing material, which is dielectric. When the optical module 1 is configured as a transmitter, the light receiving element 7 and pre-amplifier 8 are replaced by a light emitting element (not shown in the drawings) such as a laser diode. The light emitting element is configured to receive an electric signal from the circuit on the mount board 5 through the second end of the lead 2, to convert the electric signal into an optical signal and to output the optical signal through the cap 22

In case of FIG. 2C, the first portion 11 is placed adjacent to the back surface 32 and the second portion 12 is placed adjacent to the front surface 31. In another case, the first portion 11 may be placed adjacent to the front surface 31 and the second portion 12 may be placed adjacent to the back surface. In still another case, the gap 10 may contain first, second and third portions. The first portion is filled with sealing glass. The second portion and the third portion are filled with air. In that case, the second portion, the first portion and the third portion are arranged along the longitudinal direction of the hole in that order. The second portion is placed adjacent to the front surface 31, the third portion is placed adjacent to the back surface 32 and the first portion is placed between the second and the third portions.

In the another case, the region 24 can be regarded as a coaxial line that has the coaxial lines 15 and 16 connected in series. In the still another case, the region 24 can be regarded as a coaxial line that has one coaxial line 15 and two coaxial lines 16 connected in series. Thus, in the another and still another cases, the effect according to the embodiment of the present invention is the same as in the case of FIG. 2C.

It is apparent that the present invention is not limited to the above embodiment, but may be modified and changed without departing from the scope and spilit of the invention.

What is claimed is:

1. An optical module with a CAN package, comprising:
   a stem configured to have a hole penetrating said stem and an inner cylindrical surface surrounding said hole; and
   a lead configured to extend through said hole such that a gap exists between said lead and said inner cylindrical surface,
   wherein said gap contains a first portion and a second portion which are arranged along the longitudinal direction of said hole, and
   wherein said first portion is filled with sealing material which is dielectric and said second portion is filled with air.

2. The optical module according to claim 1, wherein said lead, said gap and said stem are an inner conductor, dielectric and outer conductor of a coaxial line, respectively.

3. The optical module according to claim 1, wherein said sealing material is glass.

4. The optical module according to claim 1, wherein the length of said first portion along said longitudinal direction is 80% or more and less than 100% of the length of said hole along said longitudinal direction.

5. The optical module according to claim 1, wherein said gap further contains a third portion which is filled with air, and
   wherein said second portion, said first portion and said third portion are arranged along said longitudinal direction in that order.

6. The optical module according to claim 1, further comprising:
   chip parts, wherein said stem has a front surface and a back surface,
   wherein said hole penetrates said stem from said front surface to said back surface, and
   wherein said chip parts are mounted on said front surface.

7. The optical module according to claim 1, further comprising
   a pre-amplifier; and
   a bonding wire,
   wherein said stem has a front surface and a back surface,
   wherein said hole penetrates said stem from said front surface to said back surface,
   wherein said pre-amplifier is mounted on said front surface, and
   wherein said bonding wire connects the lead and the pre-amplifier.

8. The optical module according to claim 1, further comprising:
   a cap,
   wherein said stem has a front surface and a back surface,
   wherein said hole penetrates said stem from said front surface to said back surface,
   wherein said cap covers said front surface, and
   wherein said first portion is placed adjacent to said back surface and said second portion is placed adjacent to said front surface.

9. The optical module according to claim 1, further comprising:
   a cap;
   a light receiving element,
   wherein said stem has a front surface and a back surface,
   wherein said hole penetrates said stem from said front surface to said back surface,
   wherein said cap covers said front surface,
   wherein said light receiving element is mounted on said front surface,
   wherein said lead has a first end which protrudes beyond said front surface and a second end which protrudes beyond said back surface,
   wherein said first end is electrically connected to said light receiving element, and
   wherein said light receiving element is configured to receive an optical signal through said cap, to convert said optical signal into an electric signal and to output said electric signal through said second end.

10. An optical module with a CAN package comprising:
    a first coaxial line which contains a first inner conductor, a first outer conductor and a first dielectric between said first inner conductor, and said first outer conductor;
    a second coaxial line which contains a second inner conductor, a second outer conductor and a second dielectric between said second inner conductor and said second outer conductor,
    wherein said first coaxial line and said second coaxial line are connected in series, and
    wherein said first dielectric is glass and said second dielectric is air.

* * * * *